(12) United States Patent
Wakamori et al.

(10) Patent No.: US 7,042,529 B2
(45) Date of Patent: May 9, 2006

(54) SMALL TUNER UNIT HAVING SHIELDING EFFECT

(75) Inventors: Masahiro Wakamori, Fukushima-ken (JP); Norio Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 537 days.

(21) Appl. No.: 10/308,282

(22) Filed: Dec. 3, 2002

(65) Prior Publication Data

US 2003/0107685 A1    Jun. 12, 2003

(30) Foreign Application Priority Data

Dec. 6, 2001    (JP) ............................... 2001-373117

(51) Int. Cl.
*H04N 5/64* (2006.01)
*H05K 9/00* (2006.01)
(52) U.S. Cl. .................. 348/836; 361/818; 361/816; 174/35 R; 334/85; 455/348
(58) Field of Classification Search ................ 348/836; 361/816, 818, 752; 334/85; 174/35 R; 211/41.17; 455/348, 347, 349
See application file for complete search history.

(56) References Cited

U.S. PATENT DOCUMENTS

| | | | | | |
|---|---|---|---|---|---|
| 4,404,617 | A | * | 9/1983 | Ohyama et al. ............. | 361/818 |
| 4,717,990 | A | * | 1/1988 | Tugcu ......................... | 361/816 |
| 4,747,019 | A | * | 5/1988 | Ito et al. ..................... | 361/816 |
| 5,475,876 | A | * | 12/1995 | Terada et al. ................ | 455/301 |

FOREIGN PATENT DOCUMENTS

JP    6-188586    7/1999

* cited by examiner

*Primary Examiner*—Michael H. Lee
(74) *Attorney, Agent, or Firm*—Brinks Hofer Gilson & Lione

(57) ABSTRACT

In a tuner unit, a metal shielding plate standing upright on a circuit board is provided between circuit blocks formed on the circuit board so as to electrically shield the circuit blocks from each other. A metal bridge that connects the shielding plate and a frame is provided between some circuit blocks and at a distance from the circuit board so that an electrical component can be mounted on a portion of the circuit board opposing the bridge. This makes it possible to reduce the mounting space for the electrical component and to achieve a small tuner unit.

3 Claims, 2 Drawing Sheets

SMALL TUNER UNIT HAVING SHIELDING EFFECT

BACKGROUND OF THE INVENTION

1. Field of the Invention

The present invention relates to a tuner unit for suitable use in a television.

2. Description of the Related Art

FIG. 3 is a perspective view showing the principal part of a known type of tuner unit whose cover is partially cut out, and FIG. 4 is a cross-sectional view of the principal part of the tuner unit.

The configuration of the tuner unit will be described below with reference to FIGS. 3 and 4. A box-shaped frame 51 includes four metal side walls 52, and upper and lower openings 51a and 51b.

A plurality of metal shielding plates 53 are provided in the frame 51 so as to partition the interior of the frame 51 into a plurality of compartments 54. An input coaxial connector 55 and an output coaxial connector 56 are attached to one of the side walls 52 so that they are spaced from each other.

Chip components 58, such as resistors and capacitors, are mounted on a wiring pattern (not shown) formed on the lower surface of a circuit board 57, and electrical components 59, such as coils, are mounted on the upper surface thereof while they are connected to the wiring pattern.

The circuit board 57 is also provided with a plurality of circuit blocks 60, such as an input distribution circuit 60a, an antenna tuning circuit 60, an RF tuning circuit 60c, a modulator circuit 60d, and an RF output circuit 60e.

The circuit board 57 is placed inside the frame 51 in a state in which a terminal 57a protrudes outward from the frame 51.

When the circuit board 57 is placed in the frame 51, the shielding plates 53 standing upright on the circuit board 57 are positioned between the circuit blocks 60 including the input distribution circuit 60a and the antenna tuning circuit 60b. Thereby, the electrical components 59 are shielded from one another, and the circuit blocks 60 are electrically shielded from one another.

First and second covers 61 and 62 made of a metal plate include rectangular flat portions 61a and 62a, and retaining portions 61b and 62b bent from four edges of the flat portions 61a and 62a, respectively.

The first cover 61 is mounted so that the flat portion 61a covers the opening 51a and the retaining portions 61b retain the side walls 52. The second cover 62 is mounted so that the flat portion 62a covers the opening 51b and the retaining portions 62b retain the side walls 52.

Consequently, the interior of the frame 51 is shielded by the first and second covers 61 and 62.

In the above-described known tuner unit, since the input distribution circuit 60a and the antenna tuning circuit 60b are separated by the shielding plate 53 standing upright on the circuit board 57, the electrical components 59 must be mounted at a distance from the shielding plate 53. Therefore, the circuit board 57 occupies a large area at that position, and the size thereof is increased.

Moreover, since a plurality of metal plates are used for the shielding plates 53, the assembly efficiency is decreased, and the cost is increased.

SUMMARY OF THE INVENTION

Accordingly, it is an object of the present invention to provide a small and inexpensive tuner unit having a shielding effect.

In order to overcome the above problems, according to an aspect, the present invention provides a tuner unit including a box-shaped metal frame, and a circuit board placed inside the frame and having an electrical component mounted thereon, wherein a plurality of circuit blocks are formed on the circuit board, a metal shielding plate standing upright on the circuit board is provided between the circuit blocks so as to electrically shield the circuit blocks from each other, and a metal bridge that connects the shielding plate and the frame is provided between some of the circuit blocks and at a distance from the circuit board so that the electrical component can be mounted on a portion of the circuit board, the portion opposing the bridge.

This makes it possible to reduce the mounting space for the electrical component and to achieve a small tuner unit.

Moreover, the adjoining circuit blocks can be shielded from each other by the bridge.

Preferably, the electrical component is mounted on the portion of the circuit board. This makes it possible to reduce the mounting space for the electrical component and to achieve a small tuner unit.

Preferably, the bridge is placed between an input distribution circuit block and an antenna tuning circuit block among the circuit blocks. This can be suitably applied to, in particular, a case in which the adjoining circuit blocks do not need to be shielded completely.

Preferably, the frame, the shielding plate, and the bridge are made of a single metal plate. Therefore, the assembly efficiency is enhanced and the cost can be reduced.

Further objects, features and advantages of the present invention will become apparent from the following description of the preferred embodiment with reference to the attached drawings.

DESCRIPTION OF THE PREFERRED EMBODIMENTS

Figure 1:
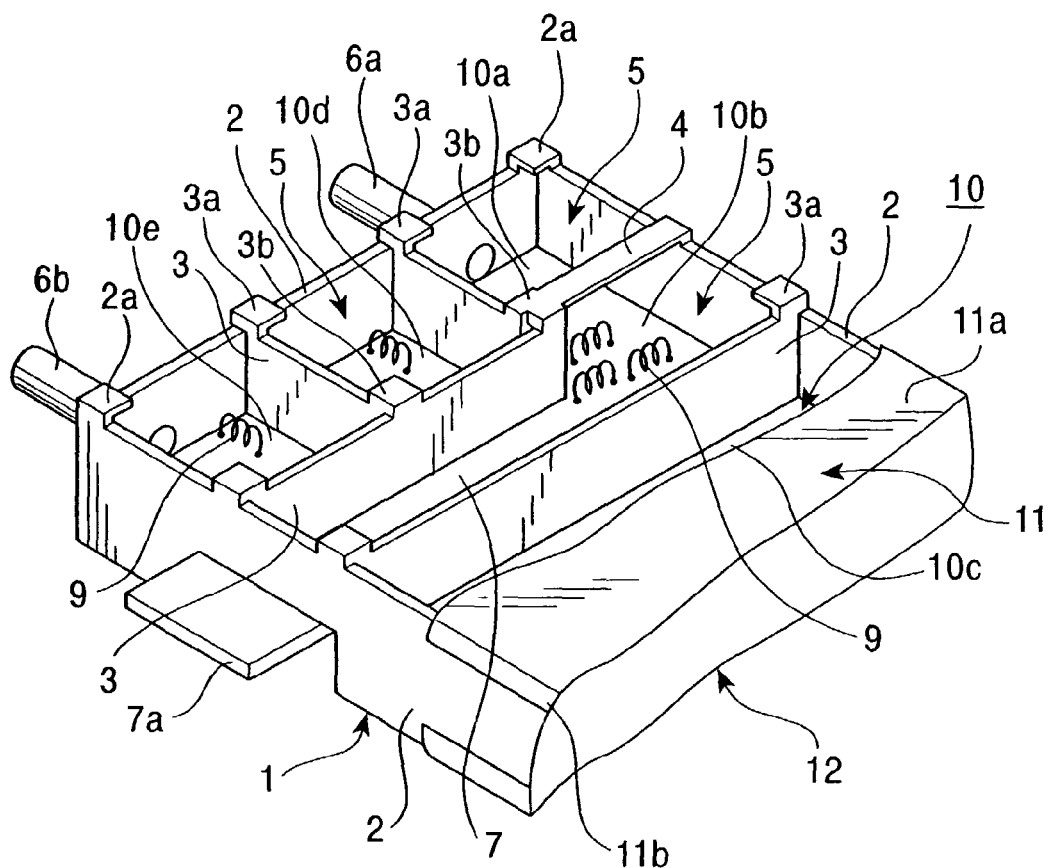
FIG. 1 is a perspective view showing the principal part of a tuner unit of the present invention, whose cover is partially cut out.
Figure 2:
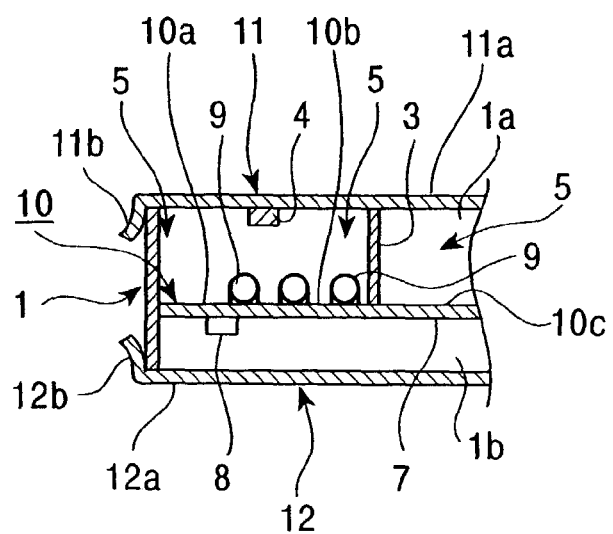
FIG. 2 is a cross-sectional view of the principal part of the tuner unit.
Figure 3:
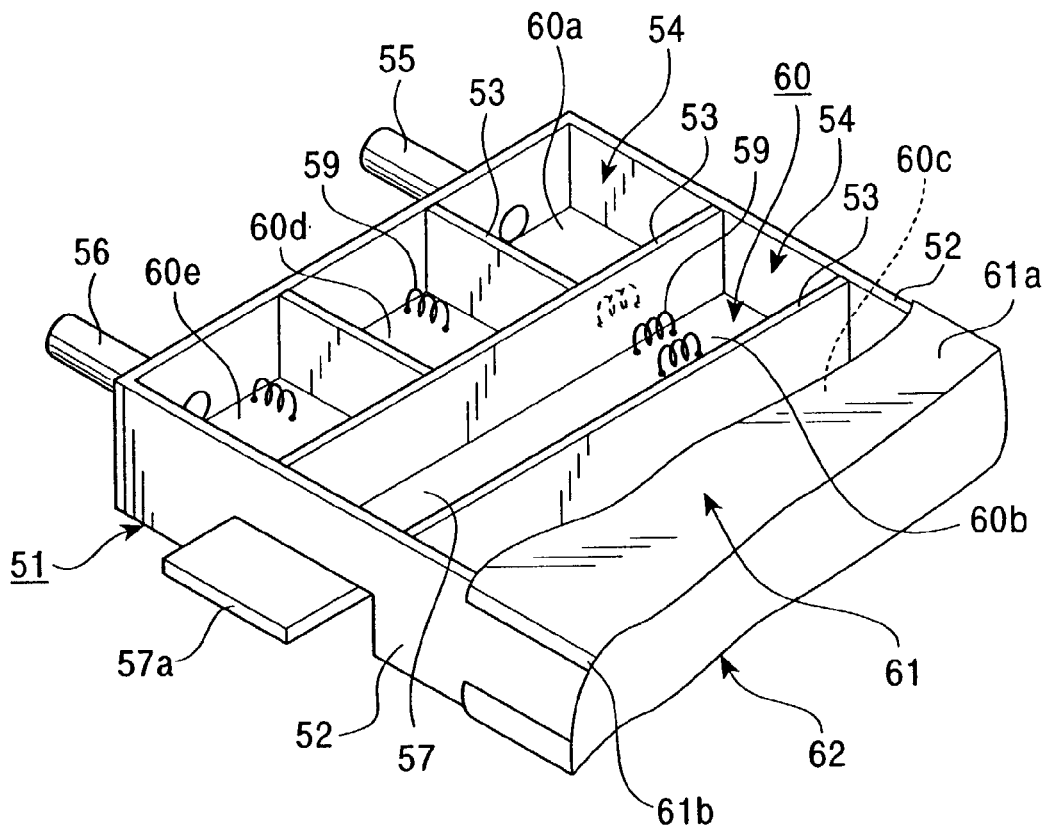
FIG. 3 is a perspective view showing the principal part of a known tuner unit whose cover is partially cut out.
Figure 4:
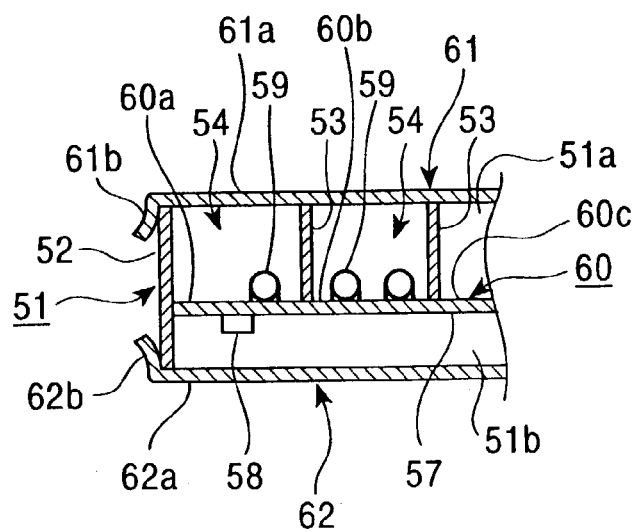
FIG. 4 is a cross-sectional view of the principal part of the known tuner unit.

FIG. 1 is a perspective view showing the principal part of a tuner unit according to an embodiment of the present invention, whose cover is partially cut out, and FIG. 2 is a cross-sectional view of the principal part of the tuner unit.

The configuration of the tuner unit of this embodiment will be described below with reference to FIGS. 1 and 2. A box-shaped frame 1 includes four metal side walls 2, and upper and lower openings 1a and 1b.

A plurality of metal shielding plates 3 are provided in the frame 1, and a bridge 4 is provided therein so as to connect one of the shielding plates 3 and one of the side walls 2, thereby partitioning the interior of the frame 1 into a plurality of compartments 5.

The frame 1, the shielding plates 3, and the bridge 4 are made of a single metal plate.

That is, as shown in FIG. 1, the frame 1 is formed by bending a metal plate at connecting portions 2a at the corners formed between the adjoining side walls 2 so that the side edges of the adjoining side walls 2 are aligned.

The shielding plates 3 are formed by bending a metal plate into the frame 1 at connecting portions 3a each of which connects one side wall 2 and one shielding plate 3, and connecting portions 3b each of which connects two shielding plates 3, thereby partitioning the interior of the frame 1.

Furthermore, the bridge 4 is connected between the connecting portion 3b of one shielding plate 3 and one side wall 2. When the side wall 2 and the shielding plate 3 are bent, the bridge 4 is flush with the connecting portions 2a, 3a, and 3b.

An input coaxial connector 6a and an output coaxial connector 6b are attached to one side wall 2 so that they are spaced from each other.

Chip components 8, such as resistors and capacitors, are mounted on a wiring pattern (not shown) formed on the lower surface of a circuit board 7, and electrical components 9, such as coils, are mounted on the upper surface thereof while they are connected to the wiring pattern.

The circuit board 7 is also provided with a plurality of circuit blocks 10 such as an input distribution circuit 10a, an antenna tuning circuit 10b, an RF tuning circuit 10c, a modulator circuit 10d, and an RF output circuit 10e.

The circuit board 7 is placed inside the frame 1 in a state in which a terminal 7a protrudes outward from the frame 1.

When the circuit board 7 is placed in the frame 1, the input distribution circuit 10a and the antenna tuning circuit 10b of the circuit blocks 10 are placed in the compartments 5 adjoining with the bridge 4 therebetween, and the other circuit blocks 10, such as the RF tuning circuit 10c, the modulator circuit 10d, and the RF output circuit 10e, are placed in the compartments 5 defined by the shielding plates 3.

In this case, the bridge 4 is disposed at a distance from the circuit board 7. The electrical components 9 of the input distribution circuit 10a and/or the antenna tuning circuit 10b are placed on a portion of the circuit board 7 opposing the bridge 4.

This makes it possible to reduce the mounting space for the electrical components 9, and to reduce the size of the circuit board 7.

First and second metal covers 11 and 12 include rectangular flat portions 11a and 12a, and retaining portions 11b and 12b bent from the four edges of the flat portions 11a and 12a, respectively.

The first cover 11 is mounted in a state in which the flat portion 11a covers the opening 1a and the retaining portions 11b retain the side walls 2, and the second cover is mounted in a state in which the flat portion 12a covers the opening 1b and the retaining portions 12b retain the side walls 2.

Consequently, the interior of the frame 1 is shielded by the first and second covers 11 and 12. Moreover, since the flat portion 11a of the first cover 11 is in contact with the bridge 4, the effect of the bridge 4 of shielding the input distribution circuit 10a and the antenna tuning circuit 10b from each other can be enhanced.

While the present invention has been described with reference to what is presently considered to be the preferred embodiment, it is to be understood that the invention is not limited to the disclosed embodiment. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

| ATTACHMENT A | |
|---|---|
| Guy W. Shoup | 26,805 |
| F. David AuBuchon | 20,493 |
| Gustavo Siller, Jr. | 32,305 |
| Jasper W. Dockrey | 33,868 |
| John C. Freeman | 34,483 |
| William F. Prendergast | 34,699 |
| Michael E. Milz | 34,880 |
| Tadashi Horie | 40,437 |
| Richard K. Clark | 40,560 |
| Joseph F. Hetz | 41,070 |
| Jason C. White | 42,223 |
| James A. Collins | 43,557 |
| Anthony P. Curtis | 46,193 |

What is claimed is:

1. A tuner unit comprising:

a box-shaped metal frame; and a circuit board placed inside said frame and having an electrical component mounted thereon, wherein a plurality of circuit blocks are formed on said circuit board, a plurality of metal shielding plates standing upright on said circuit board are provided between said circuit blocks so as to electrically shield said circuit blocks from each other, and a metal bridge that connects one of said shielding plates and said frame is provided between some of said circuit blocks and at a distance from said circuit board so that said electrical component can be mounted on a portion of said circuit board, said portion opposing said bridge, wherein said frame, said shielding plates, and said bridge are made of a single metal plate, and said frame has a rectangular shape defined by four metal side walls, wherein first connecting portions are provided at the corners formed between the adjoining side walls, second connecting portions are provide to connect said side walls and said shielding plates, and a third connecting portion is provided to connect said shielding plates, and wherein said bridge is connected between said third connecting portion and one of said side walls, and is flush with said first, second, and third connecting portions.

2. A tuner unit according to claim 1, wherein said electrical component is mounted on said portion of said circuit board.

3. A tuner unit according to claim 1, wherein said bridge is placed between an input distribution circuit block and an antenna tuning circuit block among said circuit blocks.

* * * * *